(12) United States Patent
Allegra et al.

(10) Patent No.: US 8,717,006 B2
(45) Date of Patent: May 6, 2014

(54) METHOD OF PERFORMING SYNTHETIC INSTRUMENT BASED NOISE ANALYSIS USING PROPORTIONAL BANDWIDTH SPECTRUM ANALYSIS TECHNIQUES

(75) Inventors: Alexis B. Allegra, La Jolla, CA (US); Robert W. Lowdermilk, San Diego, CA (US); Dragan Vuletic, San Diego, CA (US); Fredric J. Harris, Lemon Grove, CA (US)

(73) Assignee: BAE Systems National Security Solutions Inc., McLean, VA (US)

( * ) Notice: Subject to any disclaimer, the term of this patent is extended or adjusted under 35 U.S.C. 154(b) by 337 days.

(21) Appl. No.: 13/176,102

(22) Filed: Jul. 5, 2011

(65) Prior Publication Data

US 2013/0013262 A1    Jan. 10, 2013

(51) Int. Cl.
*G01R 23/165*     (2006.01)

(52) U.S. Cl.
USPC ............. 324/76.24; 324/76.19; 324/76.29; 324/76.31; 702/190

(58) Field of Classification Search
CPC .................................. G05B 2219/37597
USPC ......... 709/19; 324/76.19, 76.24, 76.29, 76.31
See application file for complete search history.

(56) References Cited

U.S. PATENT DOCUMENTS

| | | | | |
|---|---|---|---|---|
| 3,588,693 | A * | 6/1971 | Halley et al. | 324/76.22 |
| 4,093,989 | A * | 6/1978 | Flink et al. | 324/76.28 |
| 6,021,204 | A * | 2/2000 | Eastty | 381/12 |
| 7,076,315 | B1 * | 7/2006 | Watts | 700/94 |
| 7,158,591 | B2 * | 1/2007 | Harris | 375/350 |
| 7,649,485 | B1 * | 1/2010 | Kaplan | 341/155 |
| 2006/0200034 | A1 * | 9/2006 | Ricci et al. | 600/513 |
| 2009/0093896 | A1 * | 4/2009 | Kobayashi | 700/94 |
| 2009/0177726 | A1 * | 7/2009 | Bury | 708/313 |

OTHER PUBLICATIONS

Lowdermilk et al., "Proportional Bandwidth Spectrum Analysis in a Synthetic Instrument" Autotestcon 2010 IEEE, Sep. 13-16, 2010, pp. 1-5.*

Harris et al., "An Efficient FFT Based Spectrum Analyzer for Arbitrary Center Frequencies and Arbitrary Resolutions Analysis, Signal Processing Advances in Wireless Communications (SPAWC)" 2011 IEEE 12th International Workshop, Jun. 2011, pp. 571-575.*

Venosa et al., "An efficient constant-Q spectrum analyzer architecture using polyphase filter bank, Signals, Systems and Computers (ASILOMAR)" 2010 Conference Record of the Forty Fourth Asilomar Conference, Nov. 2011, pp. 571-575.*

(Continued)

*Primary Examiner* — John Breene
*Assistant Examiner* — John Kuan
(74) *Attorney, Agent, or Firm* — Sand & Sebolt

(57) ABSTRACT

A system and method for filtering an input signal with at least a first and a second octave portions is presented. A proportional bandwidth filter system includes a bandwidth reducing filter, a down-sampler, and first and second octave filters. The bandwidth reducing filter reduces the bandwidth of the input signal and the down-sampler rolls the second octave portion represented in the reduced bandwidth signal to a top octave portion of a down-sampled signal. The first and second octave filters are comprised of a plurality of proportional bandwidth filters. The first octave filter partitions and converts the first octave portion of the input signal into output signals representing the frequency spectra of the first octave of the input signal. Similarly, the second octave filter generates outputs representing the spectra of the second octave portion of the input signal represented as the top octave portion of a down-sampled signal.

20 Claims, 12 Drawing Sheets

(56) References Cited

OTHER PUBLICATIONS

Levine, "Critically Sampled Third Octave Filter Banks" ICMC Proceedings 1996, pp. 301-304.*

Cassidy et al., "Auditory Filter Bank Lab" REALSIMPLE Project, Jun. 5, 2008.*

Charles R. Greene, "Proportional Bandwidth Filtering", IEEE Transactions on Audio and Electroacoustics, Aug. 1973, vol. 21, Issue: 4, pp. 377-378.

Jonathan D. Locke and Paul R. White, "Detection Performance of the Fractional Fourier Transform (Chirp FFT) for Frequency Modulated Signals", 3-rd International Conference on Underwater Acoustic Measurements: Technologies & Results, Jun. 21-26, 2009, Nafplion, Greece.

Fred J. Harris, "An Efficient Constant-Q Spectral Analyzer Architecture Using All-Pass Recursive Filters" Report, Acoustic Analysis Workbench Project, 1999-2000 SPAWAR Contract No. N66001-97-D-5028.

* cited by examiner

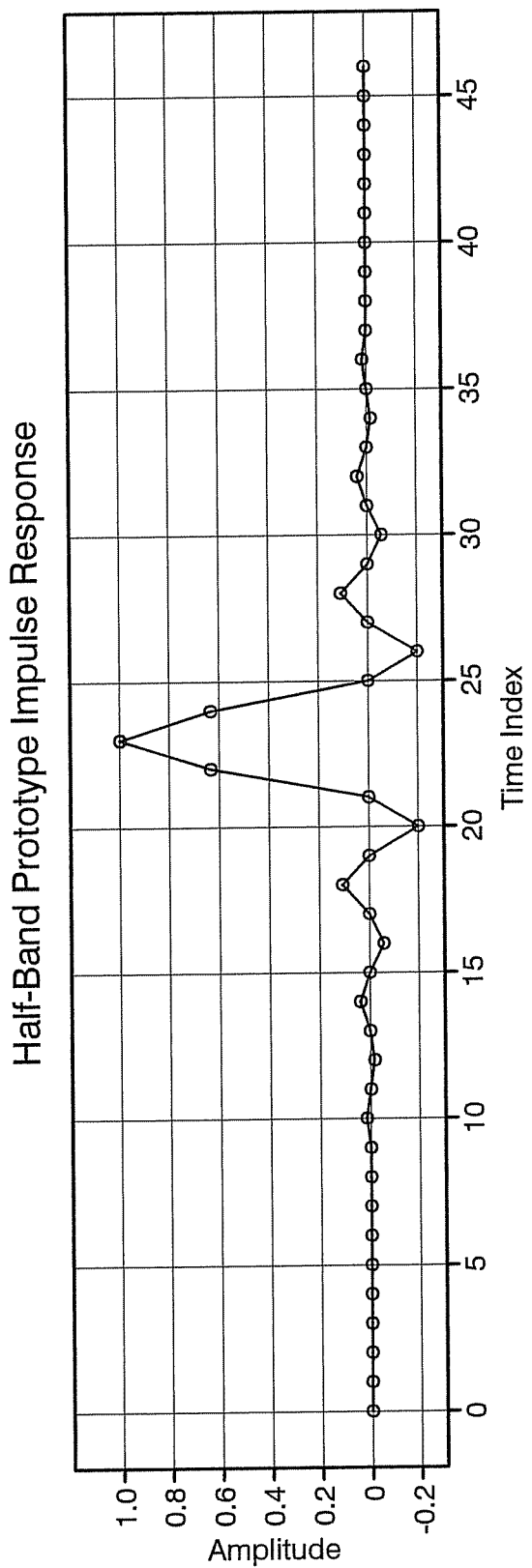

METHOD OF PERFORMING SYNTHETIC INSTRUMENT BASED NOISE ANALYSIS USING PROPORTIONAL BANDWIDTH SPECTRUM ANALYSIS TECHNIQUES

BACKGROUND OF THE INVENTION

1. Field of Invention

The current invention relates generally to apparatus, systems and methods for analyzing a spectrum of signals. More particularly, the apparatus, systems and methods relate to using filters to analyze the spectrum of a signal. Specifically, the apparatus, systems and methods provide for a proportional bandwidth spectrum analysis in a synthetic instrument.

2. Description of Related Art

A Synthetic Instrument (SI) based spectrum analyzer is a filter bank with specified bandwidth and spacing between spectral centers designed to span a spectral interval of interest. In communication system applications, the filter width and the spacing between centers are fixed. This matches the structure of communication system channelized bandwidth frequency assignments. This relationship between filter width and spectral centers in turn influenced the design of early swept frequency spectrum analyzers. They were designed around a fixed bandwidth Intermediate Frequency (IF) filter through which spectral regions were probed by shifting them to the filter with a linear time-frequency swept heterodyne.

Spectrum analyzers designed for audio and vibration analysis differ from equal space, equal bandwidth systems in that they were designed to analyze signals where the bandwidths are proportional to the center frequencies. This property is exhibited in the model of the ear as well as other mechanical resonator systems such as vibrating strings and air columns. Analyzers matched to this spectral characteristic are called constant Q analyzers where Q (the quality factor of a filter) is the ratio of a filter's center frequency to its bandwidth.

Stationary and non-stationary signals require different criteria for the proportional factor coupling bandwidth to center frequency. For stationary audio signals such as speech and music, the bandwidth is proportional to the signal center frequency so that two center frequencies an octave apart will have filter bandwidths with a ratio of 2. In order to best analyze and adjust signals with this property, a constant Q filter bank is used. Graphic equalizers and sound boards used for audio recording and playback are common examples of constant Q filter banks.

The spectra of constant Q filter banks are equally spaced and have equal bandwidth on a log scale. This property is useful for tracking harmonics which move unequal intervals in standard spectrum analyzers but move the same interval in a constant Q spectrum analyzer. For instance, if a fundamental tone moves 10% of its center frequency, its first harmonic moves 20% and its second harmonic moves 40%.

For non-stationary signals, the bandwidths are chosen to be proportional to the square root of the center frequency so that two center frequencies an octave apart have filter bandwidths with a ratio of $\sqrt{2}$. The square root proportional bandwidth spectrum analyzer offers the maximum integration gain for linearly varying FM sweeps. Investigators of dolphin communication signals, which are linear FM sweeps, use this form of spectrum analyzer.

Another important difference between standard and proportional bandwidth spectrum analyzers is the spectral range. The frequency range of audio and vibration signals span multiple decades rather than multiple octaves. Therefore there is a need for better proportional bandwidth spectrum analyzers.

SUMMARY OF THE INVENTION

The preferred embodiment of the invention includes system for filtering an input signal with at least first and second octave portions. A proportional bandwidth filter system includes a bandwidth reducing filter, a down-sampler, and first and second octave filters. The bandwidth reducing filter reduces the bandwidth of the input signal and the down-sampler rolls the second octave portion represented in the reduced bandwidth signal to a top octave portion of a down-sampled signal. The bandwidth reducing filter can be a finite impulse response (FIR) half-band filter that performs a 2-1 bandwidth reduction and the down-sampler performs a 2-1 down-sample. The first and second octave filters are comprised of a plurality of proportional bandwidth filters. The first octave filter partitions and converts the first octave portion of the input signal into output signals representing the frequency spectra of the first octave of the input signal. Similarly, the second octave filter generates outputs representing the spectra of the second octave portion of the input signal represented as the top octave portion of a down-sampled signal.

In some configurations of the preferred embodiment, the first and second octave filters further include an octave filter down-sampler to down-sample the input signal before the input signal is processed by the spaced, proportional bandwidth filters. The octave filter down-sampler can be a 2-1 down-sampler. The octave filters can include a pre-filter to reduce the bandwidth of the input signal before the input signal is processed by the octave filter down-sampler. The pre-filter can be a half-band FIR response Hilbert transform filter. The first and second octave filters can further comprise post sample filter to further reduce the bandwidth of the signal after it is processed by the octave filter down-sampler signal to create a pre-processed input signal that is input to the proportional bandwidth filters. With this architecture, additional sets of bandwidth reducing filters, down-samplers, and octave filters can be used to further additional harmonics of the input signal. For example, a typical proportional bandwidth spectrum filter will have about six sets of bandwidth reducing filters, down-samplers, and octave filters.

In the preferred embodiment, the proportional bandwidth filters and on a logarithmic scale have constant bandwidths as a function of frequency and support about 100 dB of dynamic range of a 16 bit analog-to-digital converter. The proportional bandwidth filters operated a same output rate.

Another configuration of the preferred embodiment is a multi-octave proportional spectrum analyzer that includes an initial filtering and down-sampling processor, first octave processor and a second octave processor. The initial filtering and down-sampling processor filters and down samples an input signal to produce an initial filtered signal. This also rotate a first next octave portion of the input signal into a position that was prior occupied by an initial octave portion of the input signal. The initial octave portion and the first next octave portion are adjacent portions of the frequency spectra of the input signal. The first octave processor filters out spectra of the initial octave portion of the input signal and outputs the spectra of the initial octave portion. The second octave processor filters out spectra of the first next octave portion of the input signal and to outputs the spectra of the first next octave portion. As mentioned above and discussed later additional pairs of initial filtering and down-sampling processor and octave processors can be added to filter additional octave portions of the signal.

Another configuration of the preferred embodiment is configured as a method analyzing the spectra of an input signal. The method filters the input signal to generate a filtered signal. The filtered signal is down-sampled to generate a down-sampled signal. The input signal is passed through a first bank of proportional bandwidth filters to determine the frequency spectrum a first octave portion of the input signal. Similarly, the down-sampled signal through a second bank of proportional bandwidth filters to determine the frequency spectrum a second octave portion of the input signal, wherein the second octave portion is adjacent to the first octave portion.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIGS. 8A and 8B respectively illustrate example impulse responses and frequency responses of the example half-band 2-to-1 down-sampling FIR filter of FIG. 2.

Similar numbers refer to similar parts throughout the drawings.

DETAILED DESCRIPTION

Figure 1:
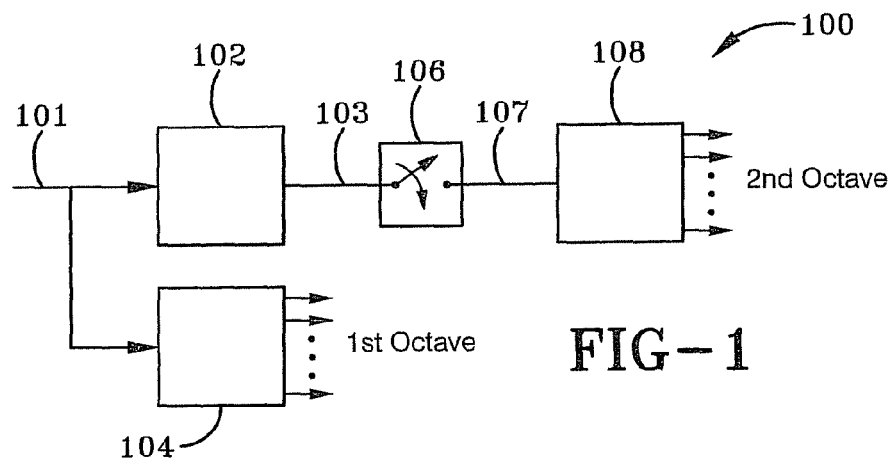
FIG. 1 illustrates a preferred embodiment of a proportional bandwidth filter.

FIG. 1 illustrates the preferred embodiment of a proportional bandwidth filter system 100 for filtering an input signal 101 with at least a first top octave portion and a second octave portion. The proportional bandwidth filter system 100 includes a bandwidth reducing filter 102, a down-sampler 106, a first octave filter 104 and a second octave filter 108. These components will be briefly introduced and then similar components will be discussed in detail below. The bandwidth reducing filter 102 reduces the bandwidth of the input signal 101 to create a reduced bandwidth signal 103. The down-sampler 106 rolls the second octave portion represented in the reduced bandwidth signal 103 to a top octave portion of a down-sampled signal 107. The first and second octave filters 104, 108 include a first and second plurality of proportional bandwidth filters respectively. These filters can be logarithmically spaced. The first octave filter 104 receives the input signal that partitions and convert the input signal 101 into a first plurality of output signals representing the frequency spectra of the first top octave portion of the input signal 101. Similar to the first octave filter 104, the second octave filter 108 receives the down-sampled signal 107 partitions and converts the second octave portion represented as the top octave portion of a down-sampled signal into a plurality of output signals representing the frequency spectra of the second octave portion of the input signal.

Figure 2:
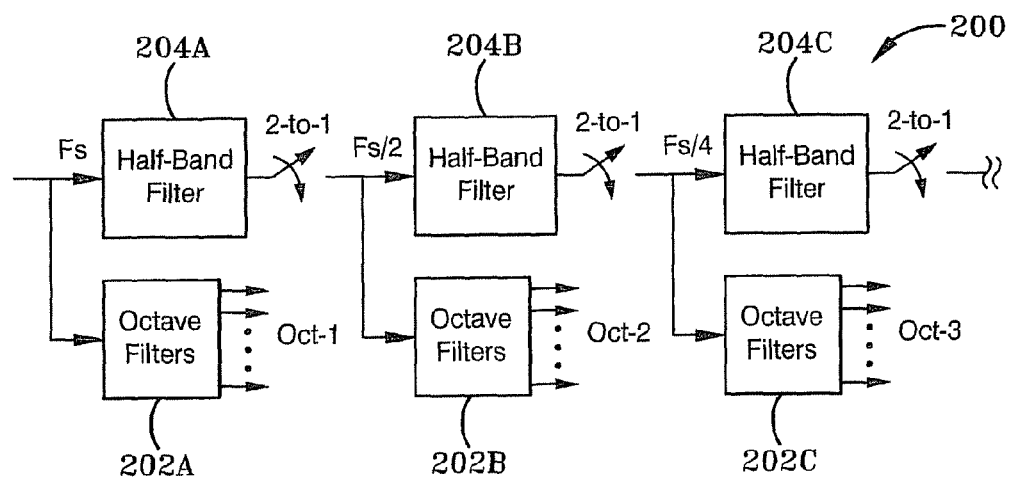
FIG. 2 illustrates another embodiment of the proportional bandwidth filter with a cascade of concurrent half-band and octave processing filters

FIG. 2 presents an architecture for a digital signal processing based proportional-bandwidth spectrum analyzer 200 that uses components similar those of FIG. 1. The architecture consists of a cascade of two parallel processing threads. A first processor 202A partitions the top octave of the input signal bandwidth into the desired number of logarithmically spaced, proportional bandwidth filters. The first processor 202A can be an octave filter similar to the first octave filter 104 of FIG. 1. Often there are 6 to 12 filters per octave though systems with many more partitions can be built. A second processor 204A similar to the half-band filter 102 and down-sampler 106 of FIG. 1 performs half-band filtering along with a 2-to-1 down-sampling commensurate with a 2-to-1 bandwidth reduction. As a result of the 2-to-1 down-sampling operation, the frequency band occupying the next lowest octave becomes the top octave at the reduced sample rate. Thus only the top octave needs to be spanned in the proportional bandwidth filter set 202A, 202B, 202C while the pre-filtering performed by the half-band filter and 2-to-1 down-sampling iteratively subjects subsequent octaves to the same fractional frequency band at successively reduced sample rates. The shifting of consecutive octaves to top octave status in successive half-band, half sample rate processing paths is illustrated in FIG. 3.

Figure 3:
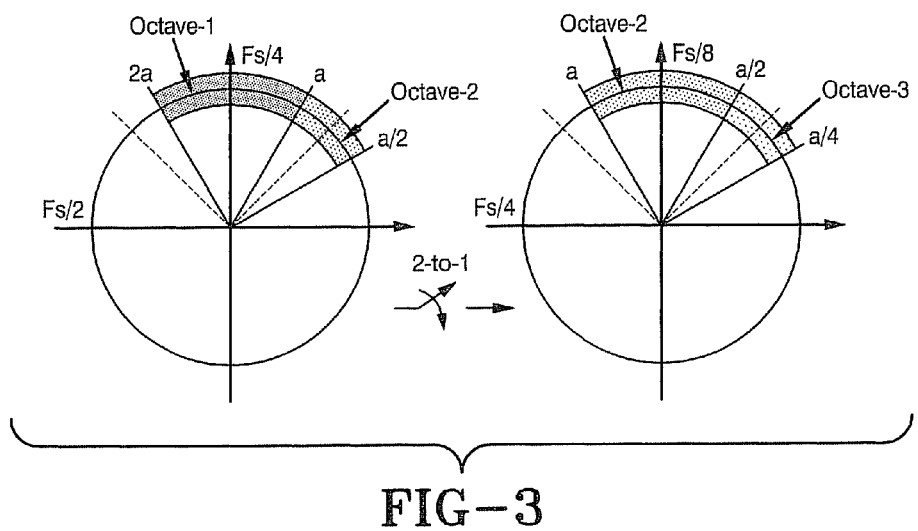
FIG. 3 illustrates a top octave at sample rate frequencies replaced by that next octave at sample rate Fs/2.

The frequency denoted "a" in FIG. 3 is the lower end of the top octave with the upper end of that octave denoted "2a." The frequencies "a" and "2a" can be any fraction of the sample rate (denoted Fs) but it is reasonable to have "2a" in the circle's second quadrant while "a" is in the circle's first quadrant. To ensure a reasonable transition bandwidth for the concurrent half-band filter it is preferable that the frequency corresponding to "2a" be less than or equal to ⅜ Fs. Reasonable contender sets for the boundaries of the top octave span the frequency intervals at the high end from 3/16 to 6/16 Fs or at the low end from ⅛ to ⅔ Fs. A particularly good choice is the span from ⅙ to ⅔ Fs. As will be shown, this choice permits an advantageous signal conditioning sequence of filtering and 2-to-1 down-sampling as part of the octave filter processing.

For the proportional bandwidth analyzer design presented in FIG. 2, the boundaries of the top octave are selected to span the interval from ⅙ to ⅔ of the input sample rate. A specific input sample rate can be used to more easily refer to specific frequencies and frequency spans. If an input sample rate of 120 kHz is assumed, then the top octave spans the interval between 20 kHz to 40 kHz. This span may be chosen to be symmetric about the quarter sample rate of 30 kHz. This gives easy access to this band following subsequent half-band filtering and 2-to-1 down-sampling. The purpose of this 2-to-1 down-sampling is to reduce the computational burden on the proportional filter bank in this block and should not be confused with the 2-to-1 down-sampling in the concurrent parallel block that shifts successive octaves into the top octave position.

Figure 4:
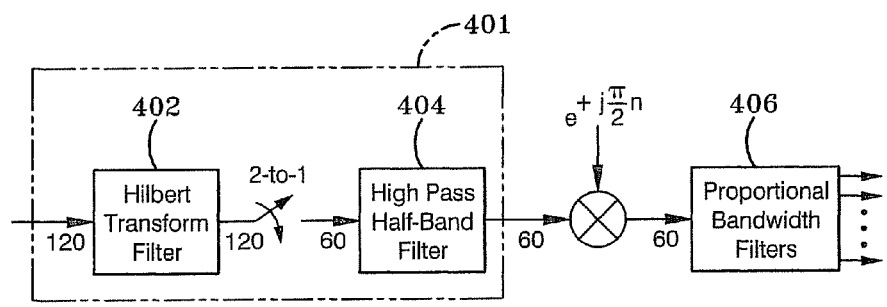
FIG. 4 illustrates an octave filter of FIG. 1 illustrating example preprocessing 2-to-1 down sample block and the octave filter bank
Figure 5A:
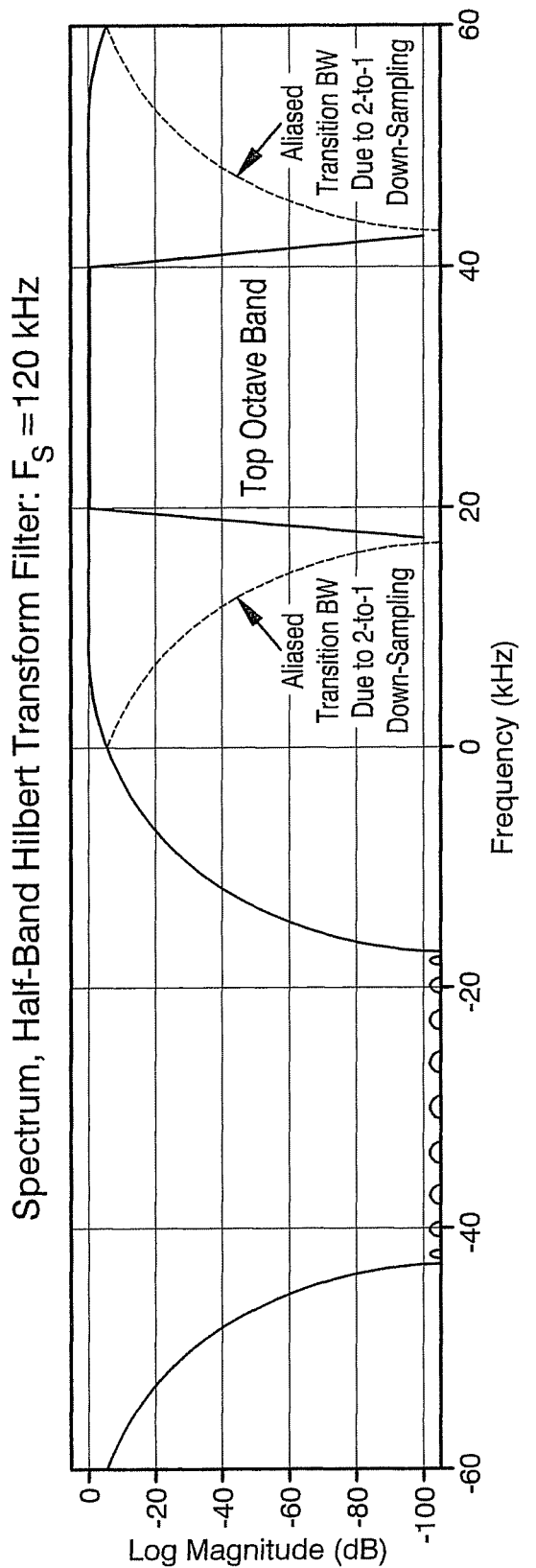
FIGS. 5A and 5B illustrate example frequency responses of the pre-processing filters of FIG. 4.
Figure 5B:
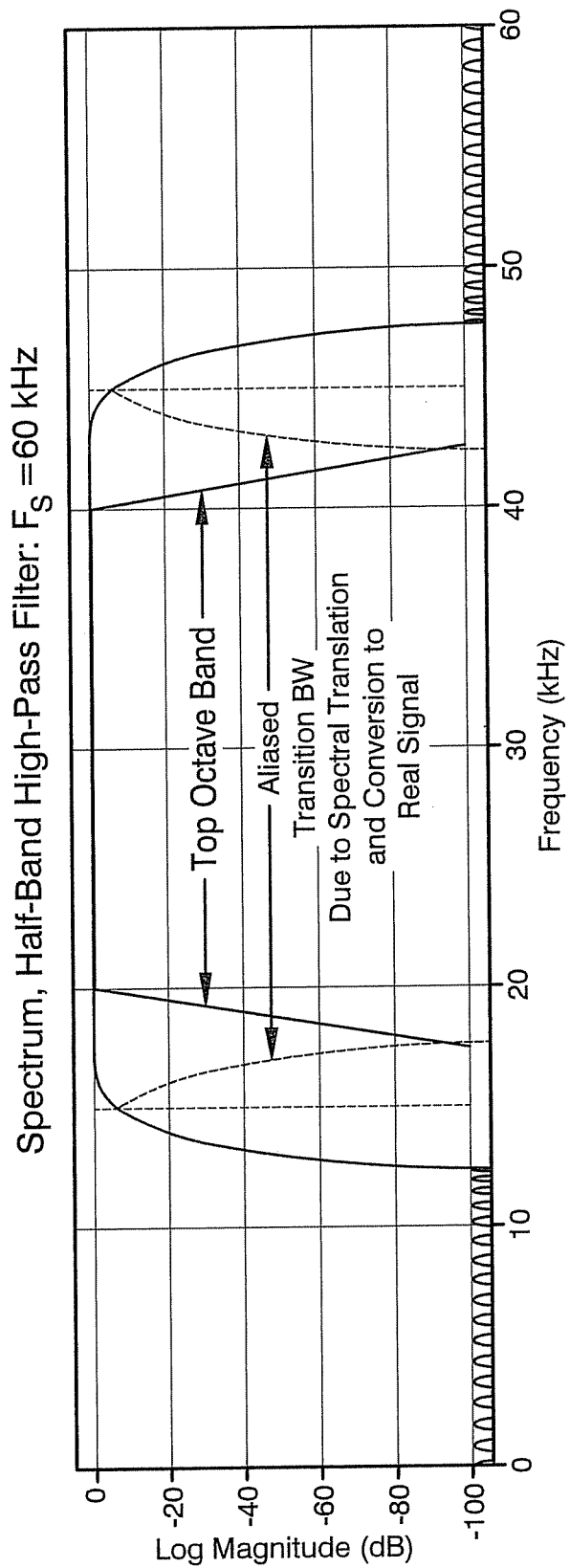

FIG. 4 illustrates the details of the octave filter blocks 202A, 202B, 202C of FIG. 2. A pre-processing block 401 preprocesses the signal input using two half-band filters 402, 404 to reduce the signal bandwidth by a factor of 4 and reduce the sample rate by a factor of 2-to-1. The frequency responses of the two filters implemented as Finite Impulse Response (FIR) filters are shown in FIG. 5.

Figure 6A:
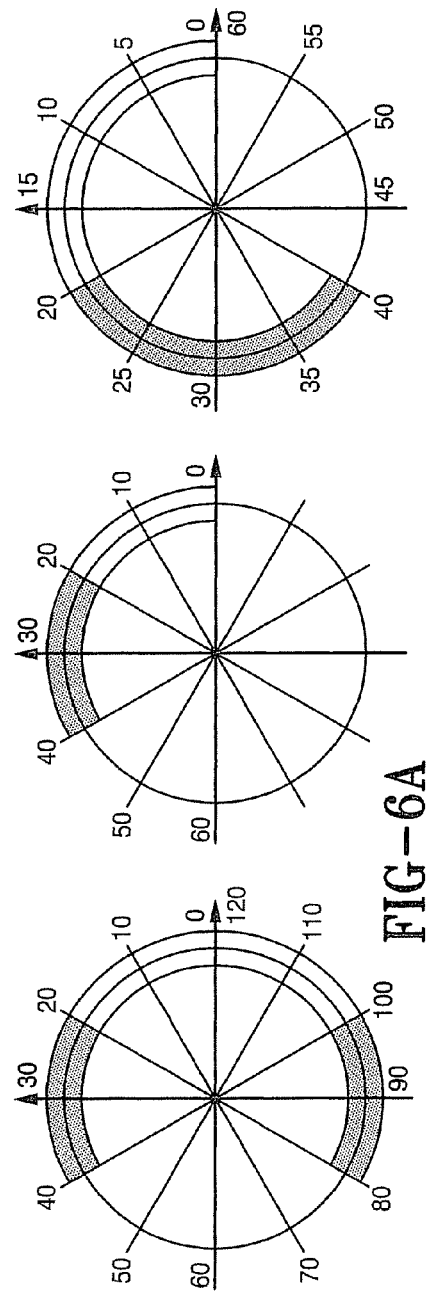
FIG. 6A illustrates example spectra at the input and output the of the example 2-to-1 down-sampled Hilbert transform filter of FIG. 4.
Figure 6B:
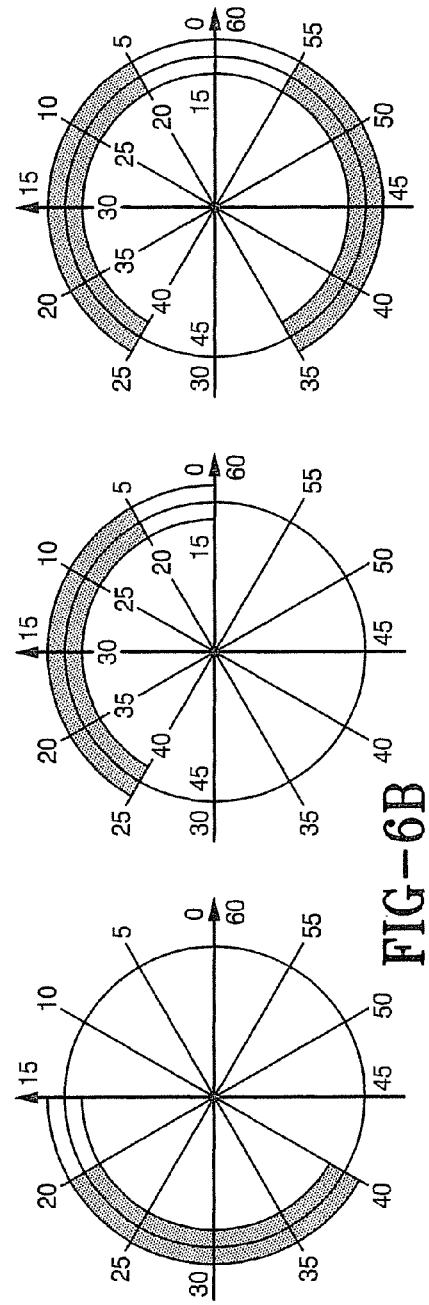
FIG. 6B illustrates example spectra at the input and output of the example half-band high-pass filter, quarter sample rate heterodyne, and complex-to-real conversion of FIG. 4.

FIGS. 6A and 6B illustrate the spectral transformations performed by the pre-processor 401. The pre-processor 401 first applies a Hilbert transform filter 402 to pass the positive frequency spectral segment of the input signal shown on the left side of FIG. 6A to obtain the spectrum shown in the center of FIG. 6a. The filtered signal is down-sampled 2-to-1 to alias the top octave band originally centered at the quarter sample rate of the input sample rate to the half sample rate of the output sample rate. The aliased spectrum is shown in the right side of FIG. 6A. The Hilbert transform and the 2-to-1 down-sampling are actually performed as a single combined operation but have been described as separate operations for a clear description of the spectral transformations.

As shown in the left side of FIG. 6B, the down-sampled time series is filtered by a half-band high pass filter to restrict the bandwidth to the spectral span extending from ⅛ to ⅜ Fs (i.e., from 15 to 45 kHz in the first pass processing block). This span contains the desired top octave extending from ⅙ to ⅔ Fs (i.e., from 20 to 40 kHz in the first pass processing block). The spectrum, with this freshly restricted bandwidth centered at the half sample rate, is then heterodyned back to the quarter sample rate to obtain the spectrum shown in the center of FIG. 6B. The shifted signal, currently represented by complex samples, is converted back to a real signal by discarding the imaginary samples to obtain the Hermitian symmetric spectrum shown in the right side of FIG. 6B. In fact, only the real samples are formed in the heterodyne process (the steps were again separated for clarity of description). Note that the spectrum of the top octave band (originally occupying the 20 kHz span between 20-to-40 kHz at the 120 kHz input sample rate) now occupies the 20 kHz span between 5-to-25 kHz at the 60 kHz output sample rate.

Figure 7A:
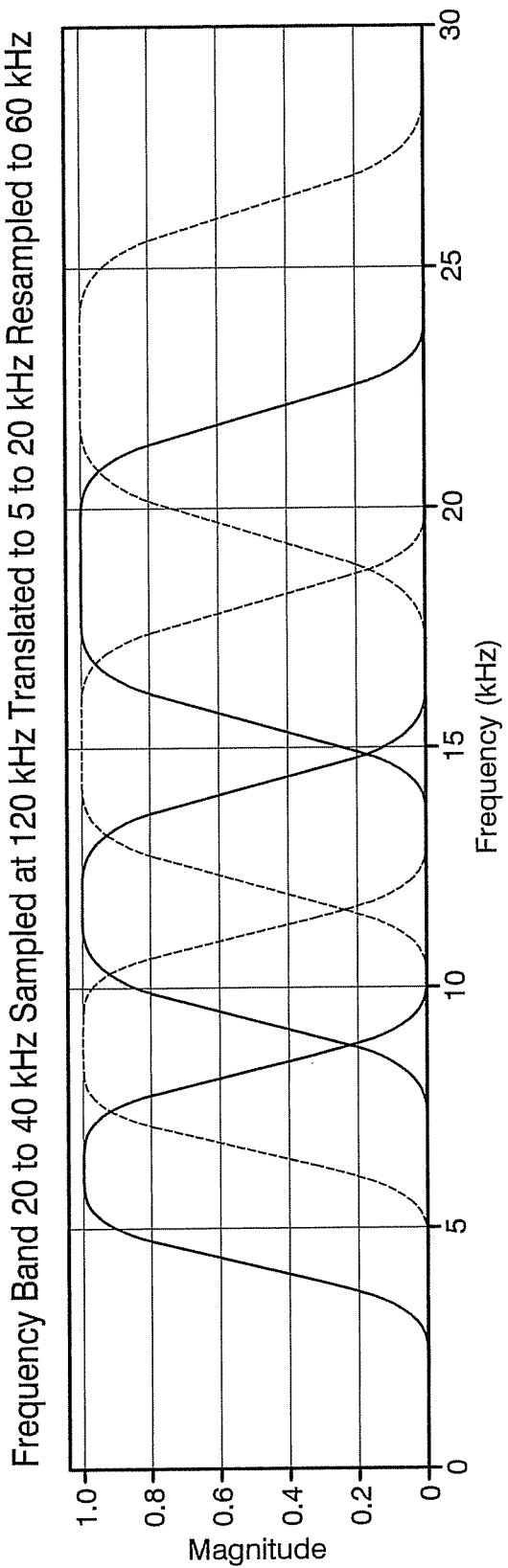
FIGS. 7A and 7B illustrate example frequency responses of the 6-proportional bandwidth filters of FIG. 4.
Figure 7B:
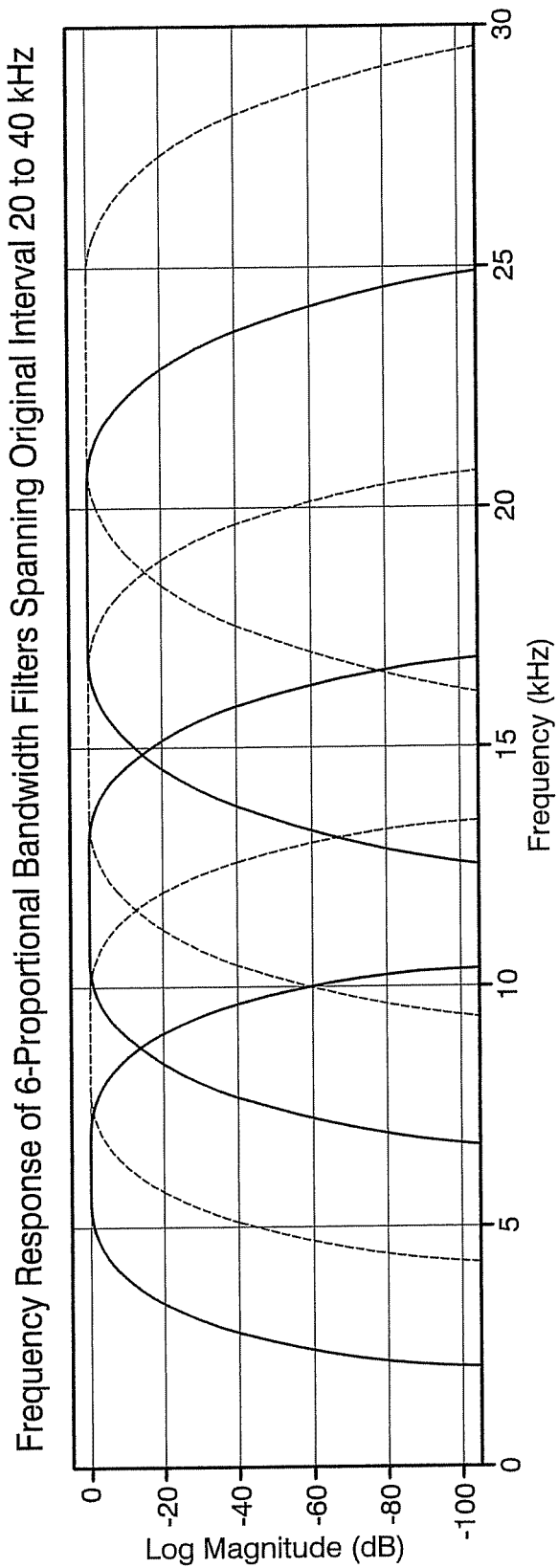

The real signal samples formed by the pre-processing blocks are then passed on for processing by the proportional bandwidth filter bank 406. Converting the filtered, down-sampled, and spectrally centered top octave to a real signal reduces the computational workload in the proportional bandwidth FIG. 7 illustrates the magnitude and log-magnitude frequency responses of six proportional bandwidth filters implemented as FIR filters. As described earlier, the frequency band they span is the top octave of the input signal extending from 20 to 40 kHz for the input sample rate of 120 kHz. The pre-processing placed this same band in the frequency interval of 5 to 25 kHz at the output sample rate of 60 kHz. The proportional bandwidth filters 406 operate within the offset frequency band at the reduced rate and at reduced implementation cost. The energy extracted from each proportional frequency is presented in spectral displays at the center frequency from which the signal was translated. As expected, this is a 25 kHz offset from the center frequency of each of the proportional bandwidth filters.

The widest bandwidth filter, the right-most of the filters in the octave filter bank, has a 3 dB and a 100 dB bandwidth of approximately 6 kHz and 13.5 kHz, respectively. Since the input sample rate to the proportional bandwidth filter bank 406 is 60 kHz, the reduced bandwidth output time series from each filter in the octave filter bank, is over sampled and can be down-sampled as part of the filtering operation. This down-sample ratio can be as small as 4-to-1 to avoid aliasing of the 100 dB band edges of the widest filter or can be as large as 10-to-1 to match the 3 dB bandwidth. A reasonable compromise would be 6-to-1 down-sampling for an output sample rate of 10 kHz corresponding to the 40 dB bandwidth of the widest bandwidth filter in the bank. In the configuration of the preferred embodiment presented here, the number of taps or coefficients required to implement each FIR filter in the filter bank is 90. The filter bank 406 can be operated at a 10 kHz output rate rather than its 60 kHz input rate. In doing so, the workload per output sample is distributed over 6 input samples, converting the 90 operations per output sample to 15 operations per input sample. For ease of memory management, all six filters in the filter bank 406 can be operated at the same output rate.

The remaining filter 402 required to implement the proportional bandwidth filter bank 406 is the half-band filter that reduces the input bandwidth by a factor of 2 while simultaneously reducing the sample rate by the same 2-to-1 ratio. The two pre-processing filters 402, 404 used in the octave band processing block 406 were also half-band filters with one reducing bandwidth and sample rate and the other simply reducing bandwidth. Note: When these half-band filters 402, 404 are properly designed, alternate samples are zero and the non-zero samples are even symmetric. When the FIR filter is implemented in the folded form, the N-tap filter requires only N/4 multiplies per output sample point. If the filter also supports the 2-to-1 down-sample operation, the workload further drops to N/8 operations per input sample point.

Figure 8B:
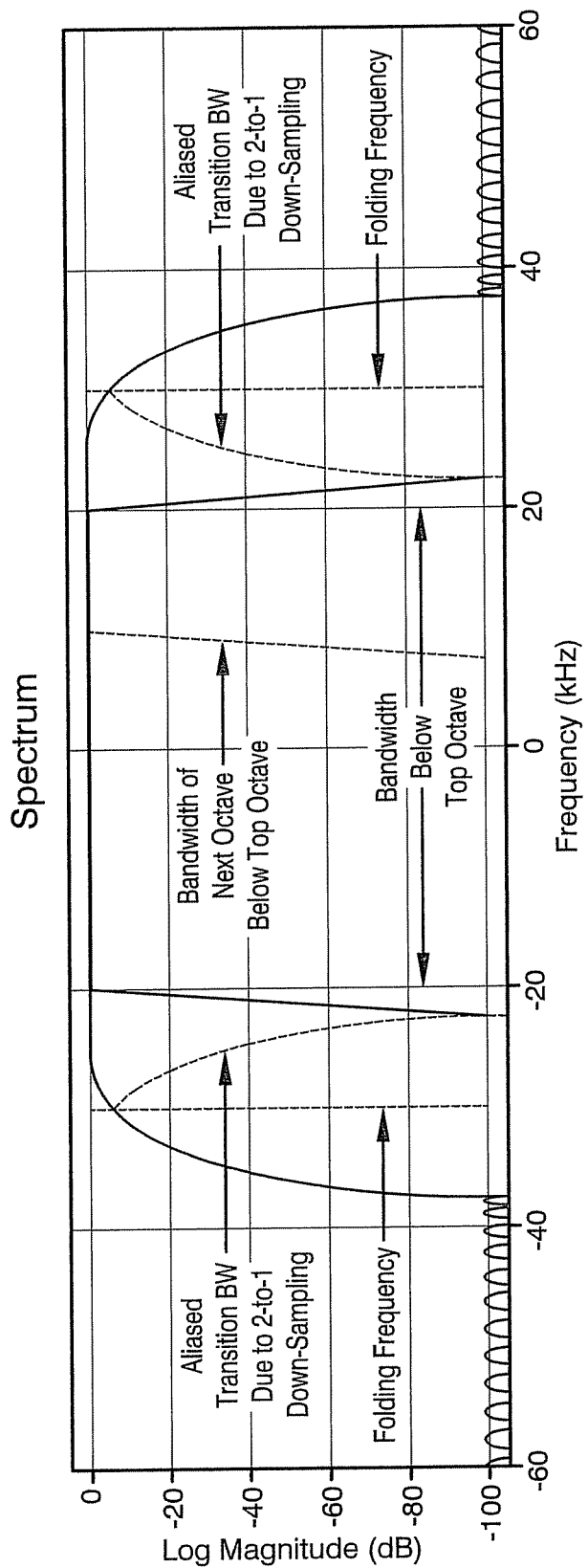

Continuing this reasoning, the half-band 2-to-1 re-sampling filter responsible for rolling successive octaves into the top octave position at successively lower sample rates is also implemented as an exact half-band filter. FIG. 8 illustrates the impulse and frequency response of this 47-tap half-band filter. Also indicated in FIG. 8 (as was shown in the earlier versions of half-band filter) is the signal bandwidth being extracted by the filter as well as the aliased transition band edges of the filter, caused by the 2-to-1 down-sampling operation. The aliased spectrum is suppressed 100 dB by the filter stop band response prior to being folded into the desired filter pass-band bandwidth.

Figure 9A:
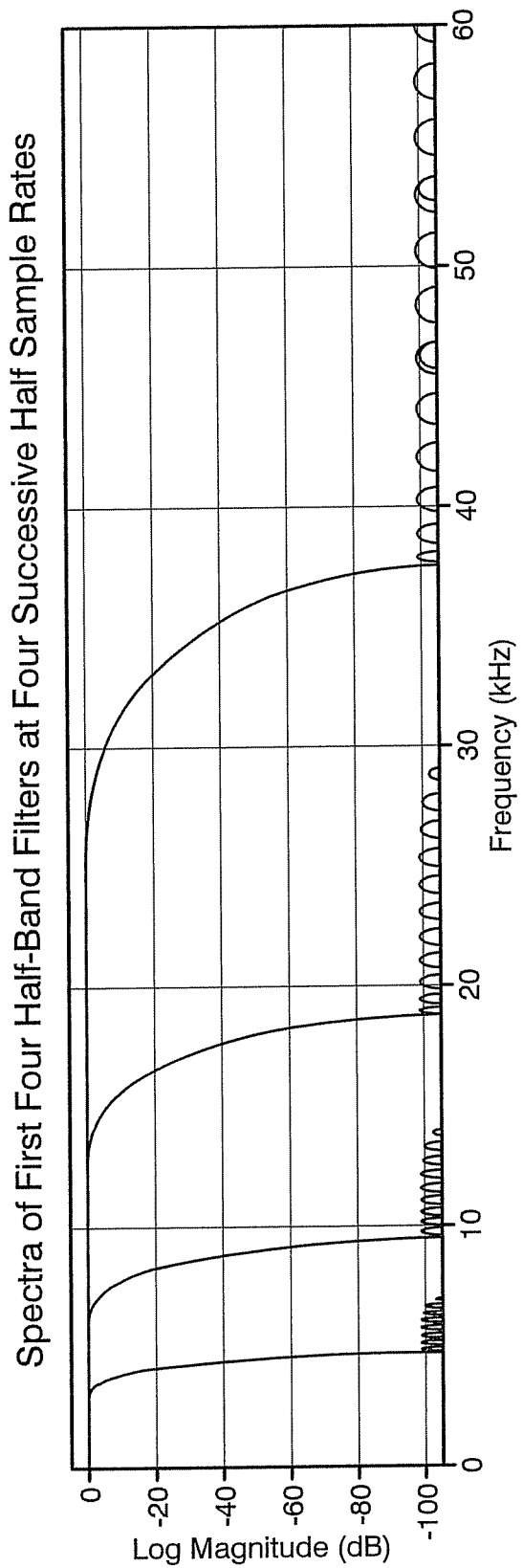
FIGS. 9A and 9B respectively illustrate spectra of the half-band 2-to-1 re-sampling filter of FIG. 2 at four successively lower half sample rates and the spectra of the 6 proportional bandwidth filters of FIG. 4 displayed at correct offset Frequency for three successive octaves.
Figure 9B:
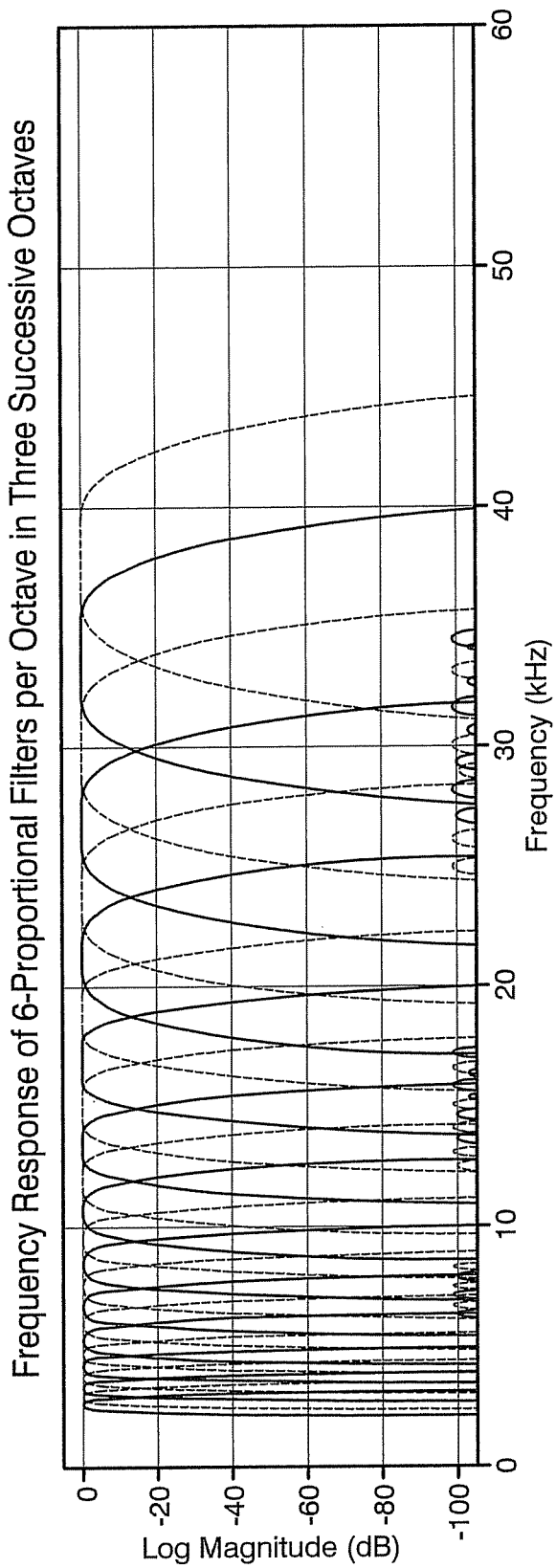

The frequency domain performance of the iterative octave processor and half-band processor can be seen in FIG. 9. The upper subplot shows the frequency response of the half-band 2-to-1 down sampling filter at four successive half sample rates, displayed on the frequency axis of the input signal sample rate. These successive filters are responsible for the bandwidth reduction and sample rate change that slides successive octaves of the input signal's spectrum to occupy the top octave position and participate in the proportional bandwidth partition.

Earlier, FIG. 7 presented the frequency response of the single top octave processed at the frequency translated and down-sampled frequency. The lower subplot of FIG. 9 shows the equivalent up-sampled and frequency offset spectra of the same top octave plotted in the band from which the octave had been translated. The subplot further shows the spectra of the partitioned bands in the next two lower octaves. In this figure, the right most positioned filter in the top octave is centered at approximately 37.4 KHz with a 3 kHz bandwidth, while the left most positioned filter in the bottom octave is centered at approximately 3.1 kHz with a 0.82 kHz bandwidth. It would take 66 filters to span the input frequency band extending from 20 Hz to 40 KHz. A logarithmic display would also be needed to see the spectral response over the 11 octave span.

Particular filters described thus far have been selected on the basis of their computational efficiency. The first task needed to address this efficiency is to estimate the workload of the octave processor composed of the two half-band filters and the six proportional bandwidth filters. All filters of the preferred embodiment can support the near 100 dB dynamic range of a 16-bit analog-to-digital converter. The filters of the configuration of the preferred embodiment illustrated in FIGS. 2-9 are summarized in Table I:

TABLE I

FILTER TYPE, LENGTH, RESAMPLE RATIO, SAMPLE RATE AND MULTIPLIES PER INPUT SAMPLE

| Filter | # taps | # Non Zero | M:1 | $F_S$ (kHZ) | Mult Per Input |
|---|---|---|---|---|---|
| Hilbert | 21 | 10 | 2:1 | 120 | 5 |
| HB-RL | 67 | 34 | 1:1 | 60 | 17 |
| HB-IM | 67 | 34 | 1:1 | 60 | 17 |
| P BW-1 | 90 | 90 | 6:1 | 60 | 7.5 |
| P BW-2 | 90 | 90 | 6:1 | 60 | 7.5 |
| P BW-3 | 90 | 90 | 6:1 | 60 | 7.5 |
| P BW-4 | 90 | 90 | 6:1 | 60 | 7.5 |
| P BW-5 | 90 | 90 | 6:1 | 60 | 7.5 |
| P BW-6 | 90 | 90 | 6:1 | 60 | 7.5 |
| HB 2:1 | 47 | 24 | 2:1 | 120 | 12 |
| Total | 674 | — | — | — | 96 |

The pre-processor Hilbert transform filter 402 was configured as an exact half-band FIR filter of length 21 taps with 10 non-zero coefficients. When the 2-to-1 down sample is embedded in this filter, the workload is 5 multiplies per input sample. The possible workload reduction due to coefficient symmetry is ignored. The second pre-processor filter 404 is the half-band filter, designed as an exact half-band FIR filter of length 67 taps with 34 non-zero coefficients. One each of this filter 404 operates on the half-rate real and imaginary components of the Hilbert transform filter output. Referenced back to the input rate, each filter requires 17 multiplies per input sample. Each of the six proportional bandwidth filters 406 was configured as a FIR filter for one of the octave bandwidths spanning the octave, each requiring 90 taps. It was noted earlier that these filters 406 could be down-sampled 6-to-1 and when referenced to the input rate, the workload per filter is 90/12 or 7.5 multiplies per input sample.

Finally, each of the half-band 2-to-1 down-sample filters 204A, 204B, 204C was designed as an exact half-band FIR filter of length 47 taps with 24 non-zero coefficients. When the 2-to-1 down-sample is embedded in this filter, the workload is 12 multiplies per input sample. Summing the workload for all filters processing the top octave, the total workload is found to be 96 multiplies per input sample to implement the top octave. Each successive octave operates at half the clock rate with half the workload per successive octave. The total workload for a large number of octaves is the sequence $96\times(1+\frac{1}{2}+\frac{1}{4}+\frac{1}{8}+\ldots)$ which is bounded by $96\times 2$ or 192 multiplies per input sample. It is remarkable that the computational requirement to compute the output time series from all the octave filters is less than 192 multiplies per input sample.

A configuration of the preferred embodiment of a proportional bandwidth filter of a multi-octave proportional bandwidth spectrum analyzer has been presented. This type of analyzer finds wide application in acoustics, speech, and vibration analysis. This analyzer uses re-sampling FIR filters to obtain six proportional filters to span an octave with a very wide dynamic range at a reasonable computational workload. The process can be extended to implement any number of filters per octave. Note that the 1988 ANSI standard for fractional octave band digital filters considered one-third octave bands as the current state of the art for acoustic measurements and that modern analyzers still conform to this standard. The one-sixth octave band analyzer presented in this paper was designed to illustrate how technology has advanced instrumentation capabilities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 10:
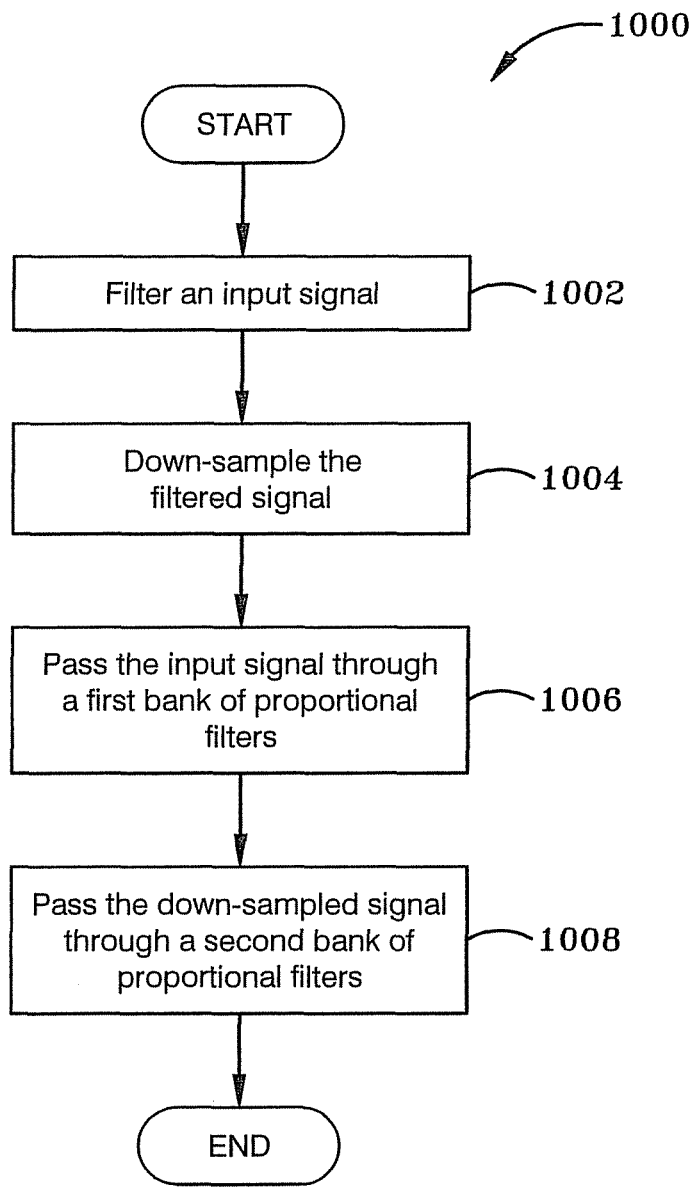
FIG. 10 illustrates an embodiment of a method for analyzing the spectra of a signal using proportional bandwidth filters.

FIG. 10 illustrates a method 1000 of analyzing the spectra of an input signal. The method 1000 begins by filtering the input signal, at 1002, to generate a filtered signal. As discussed earlier a half-band filter can be used to reduce the signal bandwidth by about half. The filtered signal is down-sampled, at 1004, to generate a down-sampled signal. Preferably the down-sampling is a 2-to-1 down-sampling so that a next octave is rotate into the position of a prior octave as discussed above with reference to figure two. The original input signal is passed through a first bank of proportional bandwidth filters, at 1006, to determine the frequency spectrum a first octave portion of the input signal. In general, there can be six filters in each bank of filters. Similarly, the down-sampled signal with the next octave (second octave) portion of the input signal in its upper portion is passed through a second bank of proportional bandwidth filters, at 1008, to determine the frequency spectrum a second octave of the input signal, wherein the frequency portion of the second octave is adjacent to the frequency portion of the first octave.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A proportional bandwidth filter system for filtering an input signal with at least a first top octave portion and a second octave portion comprising:
    a bandwidth reducing filter to reduce a bandwidth of the input signal to create a reduced bandwidth signal;
    a down-sampler to roll the second octave portion represented in the reduced bandwidth signal to a top octave portion of a down-sampled signal;
    a first octave filter to receive the input signal, wherein the first octave filter is comprised of a first plurality of proportional bandwidth filters that partition and convert the input signal into output signals representing frequency spectra of the first top octave portion of the input signal; and
    a second octave filter to receive the down-sampled signal, wherein the second octave filter is comprised of a second plurality of proportional bandwidth filters that partition and convert the second octave portion represented as the top octave portion of the down-sampled signal into output signals representing frequency spectra of the second octave portion of the input signal.

2. The proportional bandwidth filter system of claim 1 wherein the first octave filter further comprises:
    an octave filter down-sampler to down-sample the input signal before the input signal is processed by the first plurality of proportional bandwidth filters.

3. The proportional bandwidth filter system of claim 1 wherein the octave filter down-sampler is a 2-1 down-sampler.

4. The proportional bandwidth filter system of claim 2 wherein the first octave filter further comprises:
    an octave pre-filter to reduce the bandwidth of the input signal before the input signal is processed by the octave filter down-sampler.

5. The proportional bandwidth filter of claim 4 wherein the octave pre-filter is a half-band Hilbert transform filter.

6. The proportional bandwidth filter system of claim 1 wherein the first octave filter further comprises:
    an octave pre-filter to reduce the bandwidth of the input signal to create a pre-filtered signal;
    an octave filter down-sampler to down-sample the pre-filtered signal and create an octave down-sampled signal; and
    a post sample filter configured to reduce a bandwidth of the octave down-sampled signal to create a pre-processed input signal that is input to the first plurality of proportional bandwidth filters.

7. The proportional bandwidth filter system of claim 6 wherein the octave pre-filter is a half-band Hilbert transform filter, wherein the octave filter down-sampler is a 2-1 down-sampler, and wherein the post sample filter is a high pass half-band filter.

8. The proportional bandwidth filter of claim 1 wherein the bandwidth reducing filter is a finite impulse response (FIR) half-band filter that performs a 2-1 bandwidth reduction.

9. The proportional bandwidth filter system of claim 1 wherein the down-sampler performs a 2-1 down-sample.

10. The proportional bandwidth filter system of claim 1 wherein the first plurality of proportional bandwidth filters consists of about six proportional bandwidth filters.

11. The proportional bandwidth filter system of claim 1 wherein the first plurality of proportional bandwidth filters and the second plurality of proportional bandwidth filters on a logarithmic scale have constant bandwidths as a function of frequency.

12. The proportional bandwidth filter system of claim 1 wherein the first plurality of proportional bandwidth filters and the second plurality of proportional bandwidth filters operate at a same output rate.

13. A multi-octave proportional filter comprising:
    an initial filtering and down-sampling processor to filter and down sample an input signal to produce an initial filtered signal, wherein the initial filtering and down-sampling processor is configured to rotate a first next octave portion of the input signal into a position that was prior occupied by an initial octave portion of the input signal, wherein the initial octave portion and the first next octave portion are adjacent portions of frequency spectra of the input signal;
    a first octave processor to filter out spectra of the initial octave portion of the input signal and to output the spectra of the initial octave portion; and
    a second octave processor to filter out spectra of the first next octave portion of the input signal and to output the spectra of the first next octave portion.

14. The multi-octave proportional filter of claim 13 further comprising:
    an second filtering and down-sampling processor to filter and down sample the initial filtered signal to produce a second filtered signal, wherein the second filtering and down-sampling processor is configured to rotate a second next octave portion of the input signal into a position that was prior occupied by the first next octave portion of the input signal, wherein the first next octave portion and the second next octave portion are adjacent portions of the frequency spectra of the input signal; and
    a third octave processor to filter out spectra of the second next initial octave portion of the input signal and to output the spectra of the second next octave portion.

15. The multi-octave proportional filter of claim 13 wherein the first octave processor and the second octave processor each implements a plurality of digital proportional bandwidth filters, wherein each plurality of digital proportional bandwidth filters will filter at least one octave.

16. The multi-octave proportional filter of claim 15 wherein the first octave processor is implemented with a first preprocessing unit, wherein the preprocessing unit of the first octave processor down-samples and filters the input signal to produce a preprocessed signal that is input to the first octave processor, wherein the second octave processor is implemented with a second preprocessing unit, wherein the second preprocessing unit down-samples and filters the initial filtered signal to produce a second preprocessed signal that is input to the second octave processor.

17. The multi-octave proportional filter of claim 16 wherein the first preprocessing unit further comprises:
    a Hilbert transform filter;
    a 2-1 down-sampler; and
    a high pass half-band filter, wherein the input signal is passed through the Hilbert transform filter, then the 2-1 down-sampler and the high pass filter to reduce the input signal bandwidth by a factor of about four.

18. The multi-octave proportional filter of claim 17 wherein the multi-octave proportional filter does not calculate Fast Fourier Transforms and, wherein the initial filtering and down-sampling processor, the Hilbert transform filter, the down-sampler, the high pass half-band filter and the plurality of digital proportional bandwidth filters are implemented, at least in part, with finite impulse response (FIR) filters.

19. A method analyzing spectra of an input signal comprising:
   filtering the input signal to generate a filtered signal;
   down-sampling the filtered signal to generate a down-sampled signal;
   passing the input signal through a first bank of proportional bandwidth filters to determine a frequency spectrum of a first octave portion of the input signal; and
   passing the down-sampled signal through a second bank of proportional bandwidth filters to determine a frequency spectrum of a second octave portion of the input signal, wherein the second octave portion is adjacent to the first octave portion.

20. The method of claim 19 wherein the filtering the input signal further comprises:
   reducing bandwidth of the input signal by a factor of about two and wherein the down-sampling further comprises:
   down-sampling the filtered signal with a ratio of about 2-to-1.

* * * * *